US010714897B2

(12) United States Patent
Saito et al.

(10) Patent No.: US 10,714,897 B2
(45) Date of Patent: Jul. 14, 2020

(54) DISTRIBUTED FEEDBACK SEMICONDUCTOR LASER

(71) Applicant: KABUSHIKI KAISHA TOSHIBA, Minato-ku (JP)

(72) Inventors: Shinji Saito, Yokohama (JP); Tsutomu Kakuno, Fujisawa (JP); Osamu Yamane, Yokohama (JP); Akira Tsumura, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/084,898

(22) PCT Filed: Sep. 1, 2016

(86) PCT No.: PCT/JP2016/075676
§ 371 (c)(1),
(2) Date: Sep. 13, 2018

(87) PCT Pub. No.: WO2017/158870
PCT Pub. Date: Sep. 21, 2017

(65) Prior Publication Data
US 2019/0081454 A1    Mar. 14, 2019

(30) Foreign Application Priority Data
Mar. 15, 2016    (JP) .................................. 2016-051668

(51) Int. Cl.
*H01S 5/12* (2006.01)
*H01S 5/34* (2006.01)
(Continued)

(52) U.S. Cl.
CPC ............ *H01S 5/1237* (2013.01); *H01S 5/141* (2013.01); *H01S 5/3401* (2013.01);
(Continued)

(58) Field of Classification Search
CPC ..... H01S 5/1237; H01S 5/3401; H01S 5/3402
See application file for complete search history.

(56) References Cited

U.S. PATENT DOCUMENTS 7,835,418 B2 * 11/2010 Hatori ...................... H01S 5/12
                                                                    372/102
2004/0247009 A1   12/2004 Noda et al.
(Continued)

FOREIGN PATENT DOCUMENTS

JP        2003-23193 A     1/2003
JP        2006-156901 A    6/2006
(Continued)

OTHER PUBLICATIONS

Jouy, "Surface emitting multi-wavelength array of single frequency quantum cascade laser," 2015, APL, 106, 071104-1 to 071104-4. (Year: 2015).*
(Continued)

*Primary Examiner* — Michael Carter
(74) *Attorney, Agent, or Firm* — Oblon, McClelland, Maier & Neustadt, L.L.P.

(57) ABSTRACT

A distributed feedback semiconductor laser of includes a semiconductor stacked body and a first electrode. The semiconductor stacked body includes a first layer, an active layer that is provided on the first layer and is configured to emit laser light by an intersubband optical transition, and a second layer that is provided on the active layer. The semiconductor stacked body has a first surface including a flat portion and a trench portion; the flat portion includes a front surface of the second layer; the trench portion reaches the first layer from the front surface; the flat portion includes a first region and a second region; the first region extends along a first straight line; the second region extends to be orthogonal to the first straight line; and the trench portion and the second region outside the first region form a dif-
(Continued)

fraction grating having a prescribed pitch along the first straight line. The first electrode is provided in the first region.

12 Claims, 7 Drawing Sheets

(51) Int. Cl.
   *H01S 5/14* (2006.01)
   *H01S 5/042* (2006.01)
   *H01S 5/187* (2006.01)
(52) U.S. Cl.
   CPC ........ *H01S 5/3402* (2013.01); *H01S 5/04254* (2019.08); *H01S 5/1215* (2013.01); *H01S 5/187* (2013.01)

(56) References Cited

U.S. PATENT DOCUMENTS

| | | | |
|---|---|---|---|
| 2008/0144691 | A1 | 6/2008 | Hatori et al. |
| 2009/0279579 | A1 | 11/2009 | Ohnishi et al. |
| 2012/0093187 | A1 | 4/2012 | Koeth et al. |
| 2013/0307108 | A1 | 11/2013 | Nakajima et al. |
| 2015/0053922 | A1 | 2/2015 | Nakajima et al. |
| 2015/0097156 | A1 | 4/2015 | Nakajima et al. |
| 2015/0333482 | A1* | 11/2015 | Briggs .................. H01S 5/3402 372/45.01 |
| 2016/0020581 | A1 | 1/2016 | Hirose et al. |

FOREIGN PATENT DOCUMENTS

| | | |
|---|---|---|
| JP | 2008-153260 A | 7/2008 |
| JP | 2009-64838 A | 3/2009 |
| JP | 2009-231773 A | 10/2009 |
| JP | 2009-295904 A | 12/2009 |
| JP | 2010-098135 | 4/2010 |
| JP | 2011-108935 A | 6/2011 |
| JP | 2012-74446 A | 4/2012 |
| JP | 2012-526375 A | 10/2012 |
| JP | 2013-077756 A | 4/2013 |
| JP | 2014-211364 A | 11/2014 |
| JP | 2017-188700 A | 10/2017 |
| JP | 2018-93022 A | 6/2018 |
| WO | WO 2007/029538 A1 | 3/2007 |
| WO | WO 2013/172269 A1 | 11/2013 |
| WO | WO 2014/136653 A1 | 9/2014 |
| WO | WO 2016/031965 A1 | 3/2016 |

OTHER PUBLICATIONS

S. Golka et al., "Quantum cascade lasers with lateral double-sided distributed feedback grating", Applied Physics Letters, 2005, vol. 86, pp. 111103-1-111103-3.

P. Jouy et al., "Surface emitting multi-wavelength array of single frequency quantum cascade lasers", Applied Physics Letters, 2015, vol. 106, pp. 071104-1-071104-4.

K. Kennedy et al., "High performance InP-based quantum cascade distributed feedback lasers with deeply etched lateral gratings", Applied Physics Letters, 2006. 11, vol. 89, pp. 201117-1-201117-3.

D. Vaitiekus et al, "Quantum Cascade Laser VVith Unilateral Grating", IEEE Photonics Technology Letters, 2012. 12, vol. 24, No. 23, p. 2112-2114.

International Search Report dated Nov. 22, 2016, in PCT/ JP2016/ 075676 filed Sep. 1, 2016.

\* cited by examiner

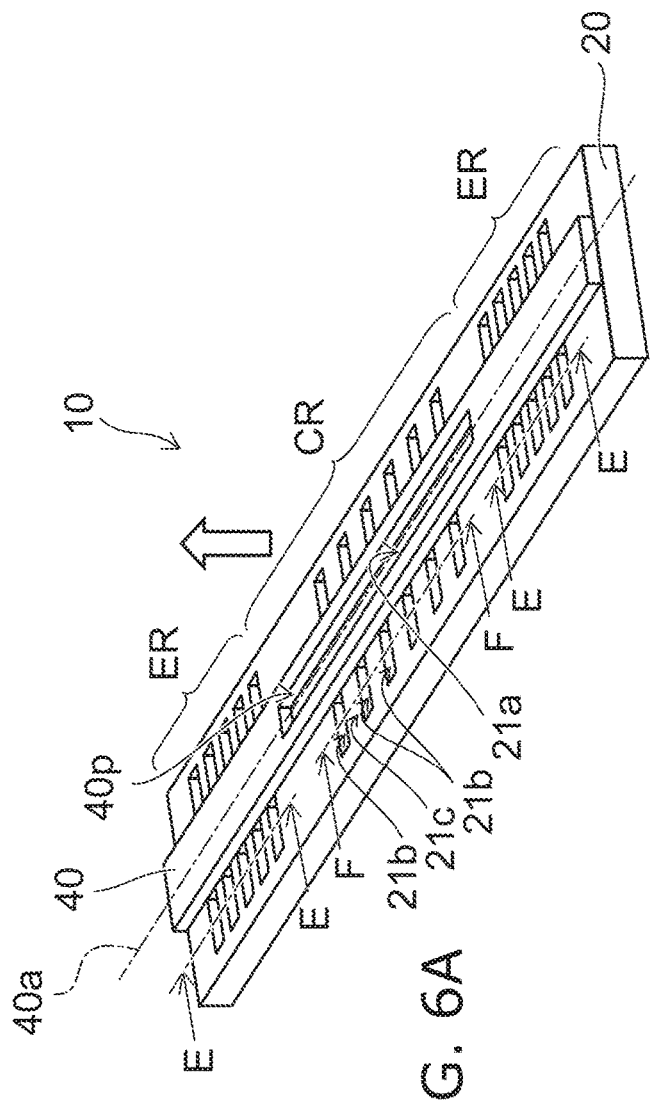
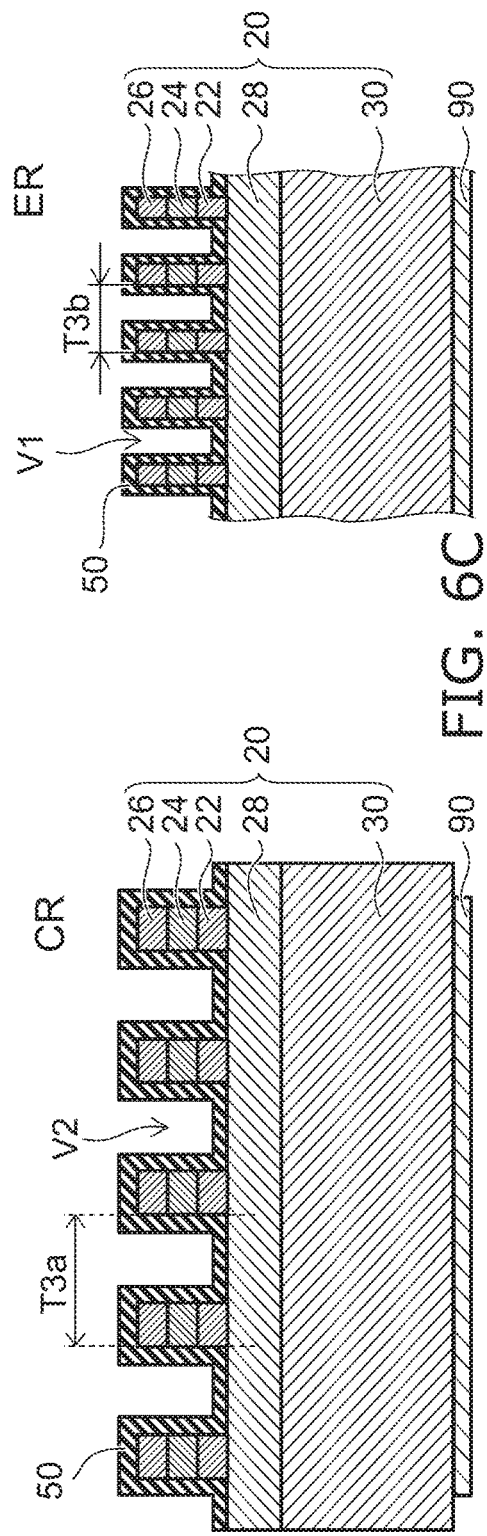
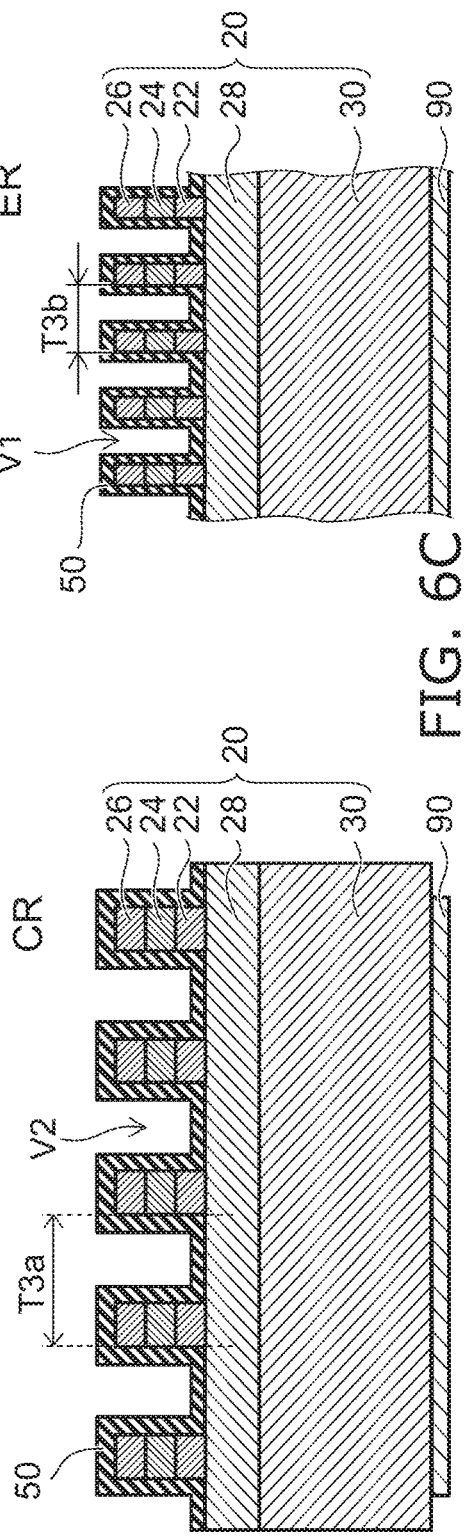

DISTRIBUTED FEEDBACK SEMICONDUCTOR LASER

TECHNICAL FIELD

This invention relates to a quantum cascade laser

BACKGROUND ART

A single-mode oscillation that has a narrow spectral width is possible in a distributed feedback semiconductor laser in which a diffraction grating is provided along the optical axis.

In a gain-guided laser in which a stripe electrode is provided on a semiconductor stacked body including an active layer, the current confinement is insufficient; and the optical confinement effect in the lateral direction is small.

If the semiconductor stacked body that includes the active layer has a ridge cross section, current confinement is possible; and the optical confinement effect increases. However, the heat dissipation in the lateral direction from the active layer is insufficient.

PRIOR ART DOCUMENT

Patent Document

[Patent Document 1] JP 2012-526375 A

SUMMARY OF INVENTION

Problem to be Solved by the Invention

A distributed feedback semiconductor laser capable of emitting laser light of a wavelength of 2 to 100 μm is provided in which the heat dissipation is improved.

Means for Solving the Problem

A distributed feedback semiconductor laser of an embodiment includes a semiconductor stacked body and a first electrode. The semiconductor stacked body includes a first layer, an active layer that is provided on the first layer and is configured to emit laser light by an intersubband optical transition, and a second layer that is provided on the active layer. The semiconductor stacked body has a first surface including a flat portion and a trench portion; the flat portion includes a front surface of the second layer; the trench portion reaches the first layer from the front surface; the flat portion includes a first region and a second region; the first region extends along a first straight line; the second region extends to be orthogonal to the first straight line; and the trench portion and the second region outside the first region form a diffraction grating having a prescribed pitch along the first straight line. The first electrode is provided in the first region.

BRIEF DESCRIPTION OF DRAWINGS

FIG. 6A is a schematic perspective view of a distributed feedback semiconductor laser according to a third embodiment. FIG. 6B is a schematic cross-sectional view of the central region along line F-F. FIG. 6C is a schematic cross-sectional view of the end portion region along line E-E.

EMBODIMENTS OF INVENTION

Embodiments of the invention will now be described with reference to the drawings.

Figure 1A:
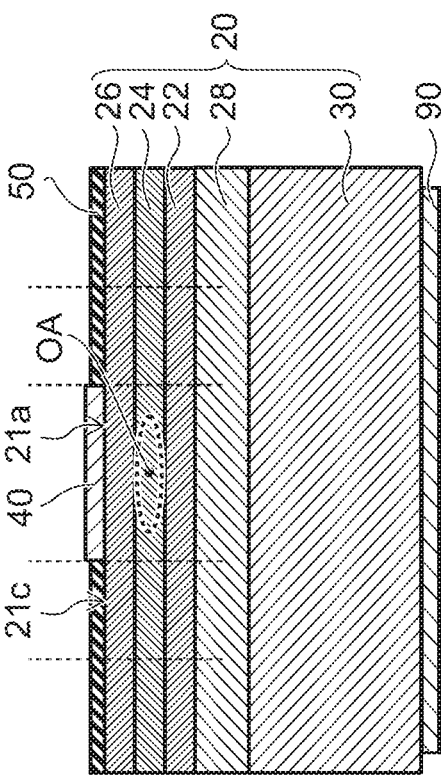
FIG. 1A is a partial schematic perspective view of a distributed feedback semiconductor laser according to a first embodiment.
Figure 1C:
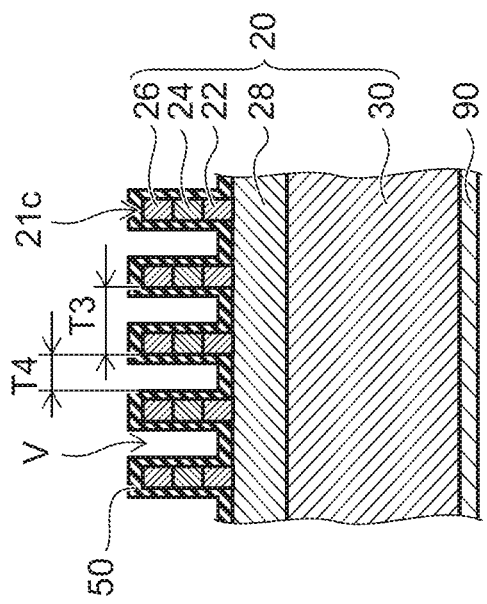
FIG. 1C is a schematic cross-sectional view along line B-B.
Figure 1B:
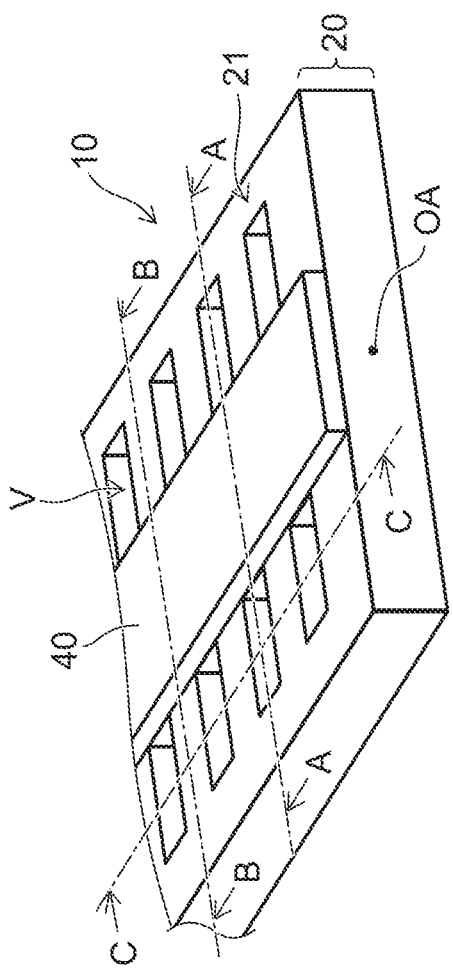
FIG. 1B is a schematic cross-sectional view along line A-A.
Figure 1D:
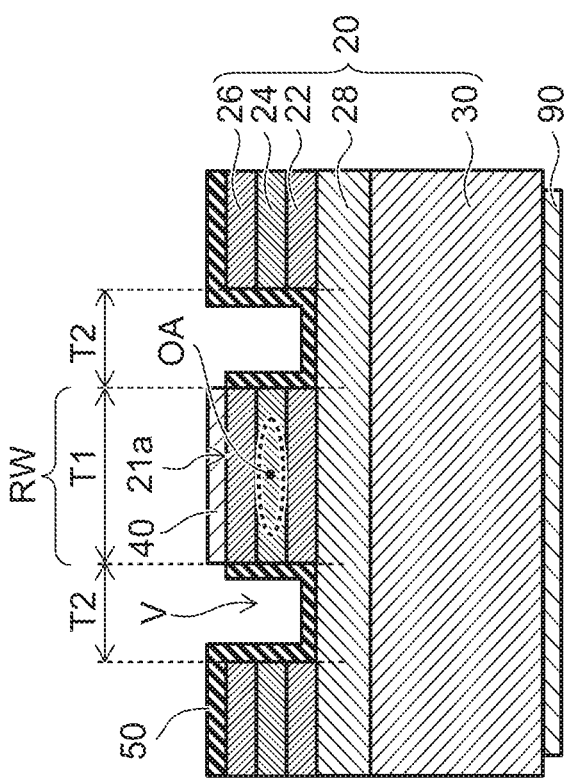
FIG. 1D is a schematic cross-sectional view along line C-C.

FIG. 1A is a partial schematic perspective view of a distributed feedback semiconductor laser according to a first embodiment; FIG. 1B is a schematic cross-sectional view along line A-A; FIG. 1C is a schematic cross-sectional view along line B-B; and FIG. 1D is a schematic cross-sectional view along line C-C.

Figure 2:
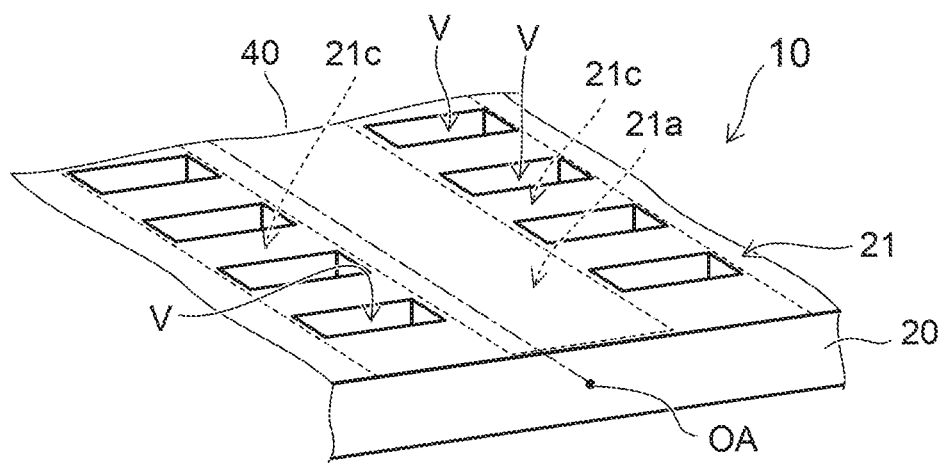
FIG. 2 is a partial schematic perspective view of a semiconductor stacked body.

Also, FIG. 2 is a partial schematic perspective view of a semiconductor stacked body.

The distributed feedback semiconductor laser 10 includes a semiconductor stacked body 20 and a first electrode 40. Also, as illustrated in FIGS. 1B to 1D, a dielectric layer 50 may be provided at the surface of the semiconductor stacked body 20. The dielectric layer is not illustrated in FIG. 1A. The semiconductor stacked body 20 includes a first layer 22, an active layer 24 that is provided on the first layer 22 and is configured to emit laser light, and a second layer 26 that is provided on the active layer 24.

Also, the semiconductor stacked body 20 has a first surface 21. The first surface 21 includes a flat portion and a trench portion V. The flat portion includes a first region 21a that extends parallel to the central axis (a first straight line OA) of the active layer 24 and has a flat surface, and a second region 21c that is arranged at a prescribed pitch T3 outside the first region 21a to be orthogonal to the first straight line OA.

The trench portion V has a depth reaching the first layer 22 from the flat portion. The cross section of the trench portion V is a V-shape, a rectangle, etc. The trench portions V and the second regions 21c are arranged alternately at the prescribed pitch T3 along the first straight line OA. The trench portion V includes inner walls, a bottom surface, etc.

The first electrode 40 is provided in the first region 21a of the first surface 21. The first electrode 40 contacts the surface of the second layer 26. The contact resistance can be reduced by providing a contact layer having a high impurity concentration at the surface of the second layer 26. Although the widths of the first electrode 40 and the second layer 26 are the same in FIGS. 1B and 1C, the embodiment is not limited thereto; and a width T1 of a ridge waveguide RW may be wider than the width of the first electrode 40. Also, it is favorable for a width T2 of the trench portion V along line A-A to sufficiently reduce the intensity of the laser light.

The distributed feedback effect can be increased by setting the pitch T3 illustrated in FIG. 1D to be, for example, ½ of the in-medium wavelength, etc. The trench portions V having the prescribed pitch T3 form a distributed reflector; and laser light that has a single light emission spectrum is emitted. In FIG. 1A, the first straight line OA is orthogonal to one of the side surfaces of the semiconductor stacked body 20. By disposing the distributed reflector along the first straight line OA, the first straight line OA can be aligned with the optical axis.

The active layer 24 has a configuration in which a relaxation region and an intersubband transition light-emitting region made of a quantum well layer including a well layer and a barrier layer are stacked alternately. The quantum well includes, for example, a well layer made of $In_{0.669}Ga_{0.331}As$ doped with Si, and a barrier layer made of $In_{0.362}Al_{0.638}As$ doped with Si. It is more favorable for the quantum well layer to have a multi-quantum well (MQW: Multi-Quantum Well) structure in which at least two well layers and multiple barrier layers are further stacked alternately. Also, the relaxation region can include a quantum well layer as well.

The semiconductor stacked body 20 can further include a substrate 30 made of InP and/or GaAs. Also, in the semiconductor stacked body 20, a buffer layer 28 can be further provided between the substrate 30 and the first layer 22. Also, a back surface electrode 90 can be provided at the back surface of the substrate 30.

The wavelength of the laser light can be set to, for example, 2 μm to 100 μm, etc.

The dielectric layer 50 can be, for example, $SiO_2$, ZnSe, CdTe, etc. The dielectric layer 50 is provided to cover the inner walls and the bottom surface of the trench portion V and the region of the front surface of the semiconductor stacked body 20 where the first electrode 40 is not provided. T4 is the opening width of the dielectric layer 50 at the upper surface of the dielectric layer 50 along line C-C.

(Table 1) illustrates an example of the width T1 of the ridge waveguide RW, the width T2 of the trench portion V, the pitch T3, and the opening width T4 of the dielectric layer 50 in the case where the wavelength of the laser light is set to 4 μm (mid-infrared), 15 μm (mid-infrared), and 80 μm (a terahertz wave).

| | WAVELENGH (μm) | | |
| --- | --- | --- | --- |
| | 4 | 12 | 80 |
| T1 | 6 | 12 | 40 |
| T2 | >4 | >14 | >60 |
| T3 | 2 | 7 | 36 |
| T4 | 1.7 | 5 | 32 |

Figure 3A:
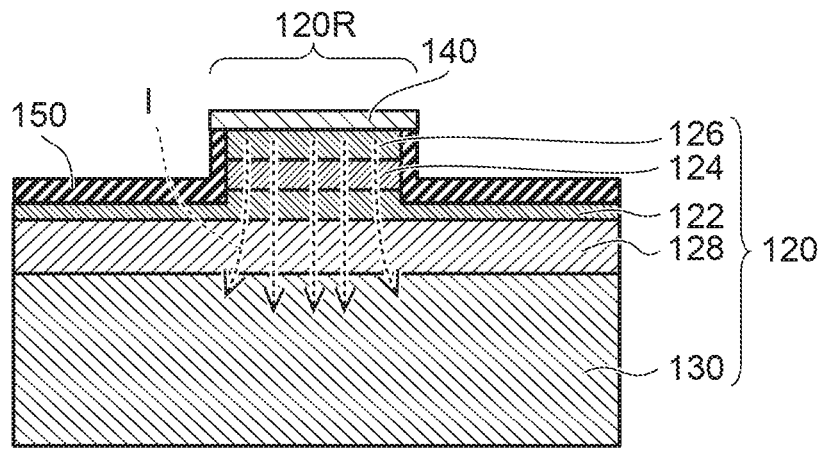
FIG. 3A is a schematic cross-sectional view of a QCL according to a first comparative example.
Figure 3B:
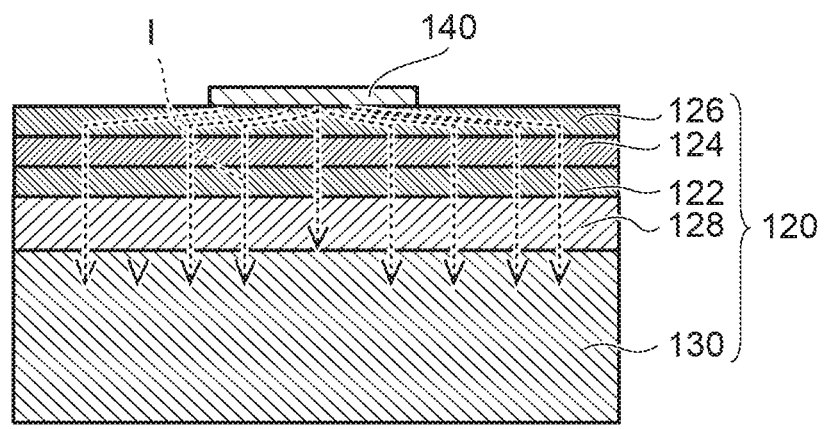
FIG. 3B is a schematic cross-sectional view of a QCL according to a second comparative example.

FIG. 3A is a schematic cross-sectional view of a QCL according to a first comparative example; FIG. 3B is a schematic cross-sectional view of a QCL according to a second comparative example; and FIG. 3C is a schematic cross-sectional view of a QCL according to a thirty-third comparative example.

In the first comparative example illustrated in FIG. 3A, a distributed reflector forms a ridge waveguide 120R along the first straight line OA. Therefore, a current I is confined; and the optical confinement effect is large. The heat that is generated in an active layer 124 is dissipated mainly downward via a first layer 122 and a substrate 130; but the dissipation in the lateral direction of the active layer 124 is low. As a result, the heat dissipation is insufficient.

Also, in the second comparative example illustrated in FIG. 3B, a ridge waveguide is not configured; and the current I that flows downward from a first electrode 140 having a stripe configuration spreads in the lateral direction. Therefore, the current confinement is insufficient; and the optical confinement effect is low. On the other hand, the heat that is generated in the active layer 124 is dissipated downward and in the lateral direction from the active layer 124; therefore, the heat dissipation that is obtained is higher than that of the first comparative example.

Figure 3C:
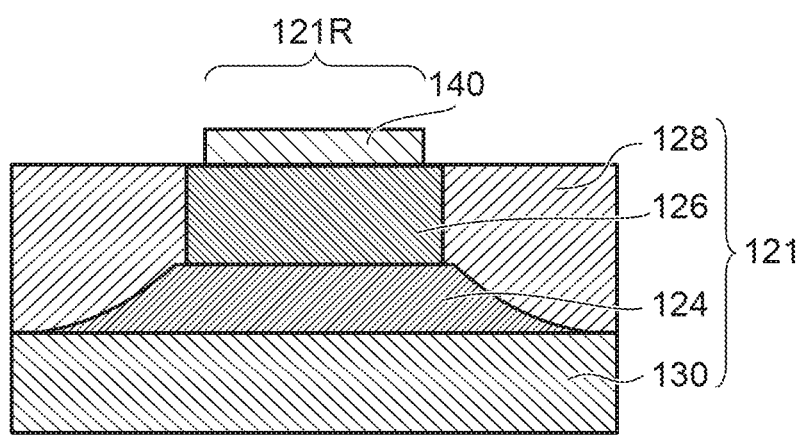
FIG. 3C is a schematic cross-sectional view of a QCL according to a thirty-third comparative example.

Also, in the third comparative example illustrated in FIG. 3C, the two side surfaces of a ridge waveguide 121R are buried in a buried layer 128 of InP, etc. Therefore, the current confinement and the heat dissipation can be improved; but a regrowth process of the buried layer 128 is necessary; and the processes are complex.

Conversely, in the first embodiment, the trench portion V is not provided directly under the first electrode 40 but is provided on the two sides of the first region 21a of the first surface 21 of the semiconductor stacked body 20. In other words, the heat that is generated in the active layer 22 in the second region 21c where the trench portion V is not provided is dissipated downward and in the lateral direction from the active layer 22. On the other hand, the trench portion V acts as a diffraction grating by which the optically-guided wave and wavelength selection are possible. In other words, in the first embodiment, the heat dissipation can be improved while maintaining the optical confinement effect. Further, because crystal growth of a buried layer is unnecessary, the processes are simple; and a price reduction is easy.

Figure 4:
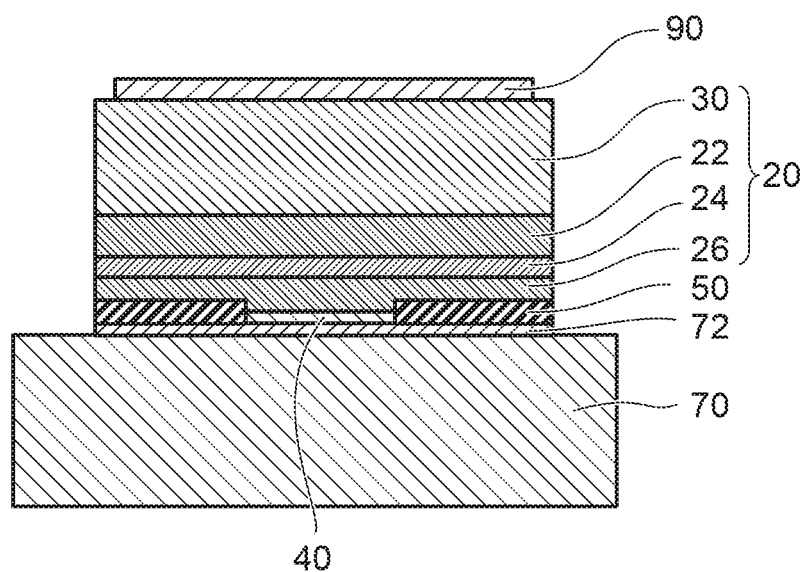
FIG. 4 is a schematic cross-sectional view of the distributed feedback semiconductor laser of the first embodiment bonded to a heat sink.

FIG. 4 is a schematic cross-sectional view of the distributed feedback semiconductor laser of the first embodiment bonded to a heat sink.

The heat sink 70 that is made of a metal and the first electrode 40 are bonded using a conductive bonding agent such as AuSn, etc. The heat that is generated in the active layer 24 is conducted through the second layer 26 and the first electrode 40 and is dissipated to the outside via the heat sink 70. The thermal resistance can be lower than when the substrate 30 side is bonded to the heat sink.

By setting the trench portion V to be deeper than the active layer 24 (reaching the first layer 22), the coupling with the distributed reflector can be high. In a p-n junction edge-emitting LD, COD (Catastrophic Optical Damage) is induced due to recombination at the end surface. In the first embodiment, the coupling efficiency can be increased while suppressing the COD damage.

Figure 5A:
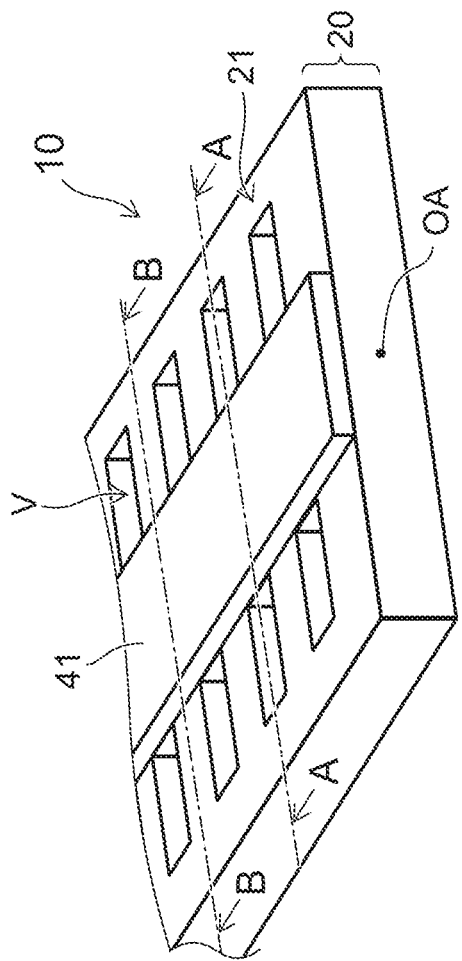
FIG. 5A is a partial schematic perspective view of a distributed feedback semiconductor laser according to a second embodiment.
Figure 5C:
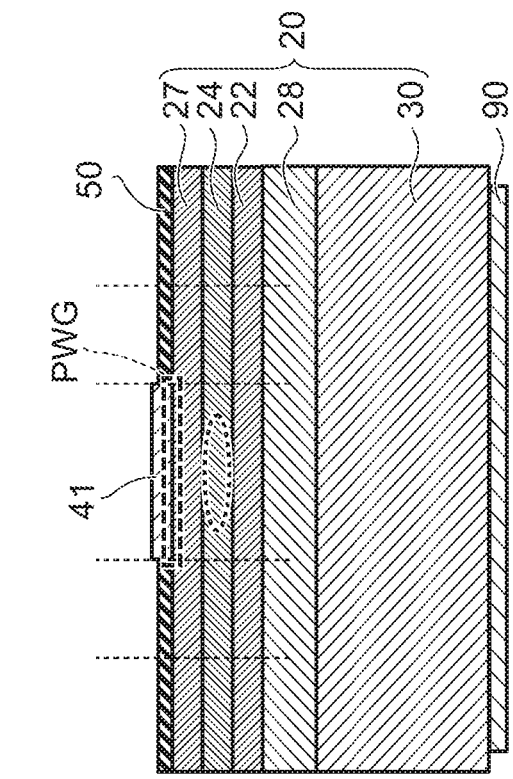
FIG. 5C is a schematic cross-sectional view along line B-B.
Figure 5B:
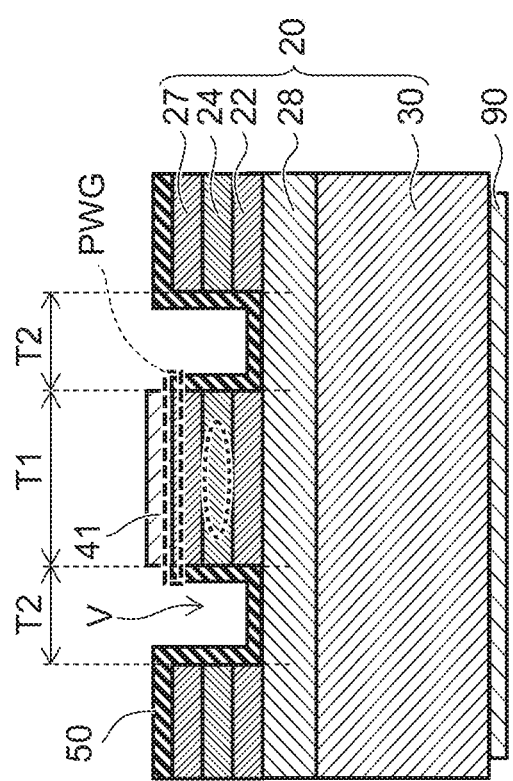
FIG. 5B is a schematic cross-sectional view along line A-A.

FIG. 5A is a partial schematic perspective view of a distributed feedback semiconductor laser according to a second embodiment; FIG. 5B is a schematic cross-sectional view along line A-A; and FIG. 5C is a schematic cross-sectional view along line B-B.

A second layer 27 is provided on the active layer 24. A first electrode 41 is provided on the second layer 27. For example, the second layer 27 is made of InGaAs; and the n-type impurity concentration is high such as $1 \times 10^{20}$ cm$^{-1}$, etc. The first electrode 41 is, for example, Au and Ti stacked in this order from the second layer 27 side. The interface between the first electrode 41 and the second layer 27 functions as a surface plasmon waveguide PWG in which the first electrode 41 has a negative dielectric constant and the second layer 27 has a positive dielectric constant.

The laser light has a TM (Transverse Magnetic) mode guided by the interface. In other words, a cladding layer may not be provided at the upper portion of the active layer 24. For far infrared having a wavelength of 20 µm or more, the optical loss can be reduced further by the surface plasmon waveguide.

FIG. 6A is a schematic perspective view of a distributed feedback semiconductor laser according to a third embodiment; FIG. 6B is a schematic cross-sectional view of the central region along line F-F; and FIG. 6C is a schematic cross-sectional view of the end portion region along line E-E.

Of the first surface 21 of the semiconductor stacked body 20, the pitch of the diffraction grating provided on the two sides of the first region 21a where the first electrode 40 is provided is different between a central portion CR of the chip and an end portion ER of the chip. The diffraction grating of the central portion CR is of a higher order than the diffraction grating of the end portion ER.

For example, in the drawing, the central portion CR has a second-order diffraction grating (a pitch T3a); and the end portion ER has a first-order diffraction grating (a pitch T3b). Also, in the central portion CR, the first electrode 40 has an opening 40p.

The first-order diffraction grating and the second-order diffraction grating each act as distributed reflectors for the laser light. In the embodiment, the opening 40p that has a length of several tens of µm along a central axis 40a of the first electrode 40 is provided in the first region 21a adjacent to trench portions V2 forming the second-order diffraction grating. By the resonator that includes the distributed reflector, single-mode laser light can be emitted in a direction substantially perpendicular to the active layer 24.

Here, the reason that the laser light can be emitted in the substantially perpendicular direction is described. In a waveguide, the following formula holds, wherein the diffraction angle due to the diffraction grating is θ, the order of the diffraction grating is M (an integer), and the diffraction order is m (an integer).

$$\cos\theta = 1 \pm 2m/M$$

In the case of a second-order diffraction grating, the mode of m=1 is scattered in ±90 degree directions with respect to the waveguide. In the modes of m=0 and m=2, the scattering is in directions parallel to the waveguide; therefore, the radiated light substantially is only in ±90 degree directions. Substantially perpendicular is taken to be not less than 8081 degrees and not more than 100 degrees with respect to the surface of the active layer 24.

For example, the full width at half maximum (FWHM: Full Width at Half Maximum) of the far-field image aligned with the ridge waveguide was 2 degrees or less, etc., and could be sufficiently narrow. In other words, the second-order diffraction grating acts as a photonic crystal that can emit laser light from the front surface of the semiconductor stacked body 20 while acting as a distributed reflector. Also, by increasing the reflectance of the distributed reflector of the end portion ER of the chip, the leakage of the light from the end surface can be reduced.

Figure 7:
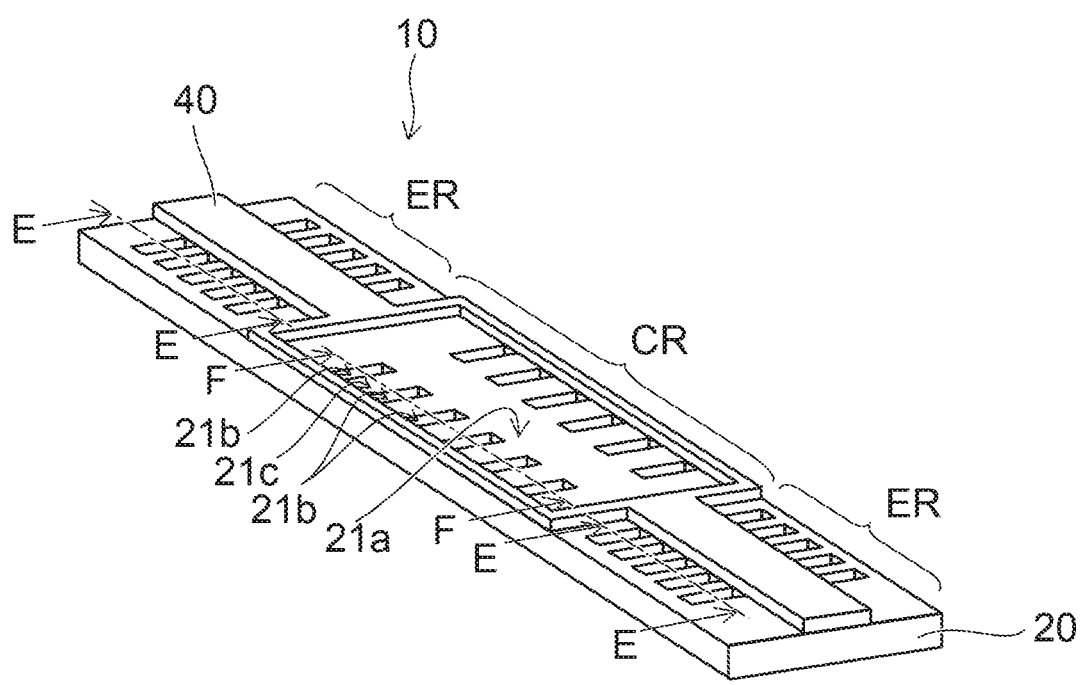
FIG. 7 is a schematic perspective view of a distributed feedback semiconductor laser according to a modified example of a third embodiment.

FIG. 7 is a schematic perspective view of a distributed feedback semiconductor laser according to a modified example of a third embodiment.

In the central portion CR of the chip, the first electrode 40 may be provided to detour outside the trench portions V.

According to the first to third embodiments and the modifications accompanying the first to third embodiments, a distributed feedback semiconductor laser that is capable of emitting single-mode laser light having a wavelength of 2 to 100 µm is provided in which the heat dissipation is improved. Such a distributed feedback semiconductor laser is widely applicable to environmental measurement, exhalation measurement, laser processing, etc.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A distributed feedback semiconductor laser, comprising:
   a semiconductor stacked body including a first layer, an active layer, and a second layer, the active layer being provided on the first layer and being configured to emit laser light by an intersubband optical transition, the second layer being provided on the active layer; and
   a first electrode, wherein
   the semiconductor stacked body has a first surface including a flat portion and trench portions, the flat portion includes a top surface of the second layer, the trench portions include inner walls and bottom surfaces, the flat portion includes a first region and a second region, the first region extends along a first straight line, the second region extends to be orthogonal to the first straight line, and the trench portions form different diffraction gratings having prescribed pitches along the first straight line, the semiconductor stacked body has a ridge waveguide between two trench portions in a cross-section orthogonal to the first straight line,
   the first electrode is provided in the first region,
   heat generated in parts of the active layer sandwiched by the second region, where the trench portions and the ridge waveguide are not provided, is dissipated downward and in a lateral direction, and
   a pitch along the first straight line in the second region in a central portion forms a second-order diffraction grating, which is laterally positioned next to the ridge waveguide.

2. The distributed feedback semiconductor laser according to claim 1, wherein the trench portions are provided laterally symmetrically with respect to a central axis of the first electrode.

3. The distributed feedback semiconductor laser according to claim 2, wherein a wavelength of the laser light is not less than 2 µm and not more than 100 µm.

4. The distributed feedback semiconductor laser according to claim 3, wherein the laser light is emitted from a side surface of the semiconductor stacked body orthogonal to the first straight line among side surfaces of the semiconductor stacked body.

5. The distributed feedback semiconductor laser according to claim 3, wherein
   another pitch along the first straight line in the second region provided at end portions on two sides of the central portion forms a first-order diffraction grating,
   an opening is provided in the first electrode in a region adjacent to the central portion, and
   the laser light is emitted in a substantially perpendicular direction from the first region exposed at the opening.

6. The distributed feedback semiconductor laser according to claim 2, wherein the laser light is emitted from a side surface of the semiconductor stacked body orthogonal to the first straight line among side surfaces of the semiconductor stacked body.

7. The distributed feedback semiconductor laser according to claim 2, wherein
   another pitch along the first straight line in the second region provided at end portions on two sides of the central portion forms a first-order diffraction grating,
   an opening is provided in the first electrode in a region adjacent to the central portion, and
   the laser light is emitted in a substantially perpendicular direction from the first region exposed at the opening.

8. The distributed feedback semiconductor laser according to claim 1, wherein a wavelength of the laser light is not less than 2 µm and not more than 100 µm.

9. The distributed feedback semiconductor laser according to claim 8, wherein the laser light is emitted from a side surface of the semiconductor stacked body orthogonal to the first straight line among side surfaces of the semiconductor stacked body.

10. The distributed feedback semiconductor laser according to claim 8, wherein
   another pitch along the first straight line in the second region provided at end portions on two sides of the central portion forms a first-order diffraction grating,
   an opening is provided in the first electrode in a region adjacent to the central portion, and
   the laser light is emitted in a substantially perpendicular direction from the first region exposed at the opening.

11. The distributed feedback semiconductor laser according to claim 1, wherein the laser light is emitted from a side surface of the semiconductor stacked body orthogonal to the first straight line among side surfaces of the semiconductor stacked body.

12. The distributed feedback semiconductor laser according to claim 1, wherein
   another pitch along the first straight line in the second region provided at end portions on two sides of the central portion forms a first-order diffraction grating,
   an opening is provided in the first electrode in a region adjacent to the central portion, and
   the laser light is emitted in a substantially perpendicular direction from the first region exposed at the opening.

* * * * *